United States Patent
Micovic et al.

(10) Patent No.: US 9,496,197 B1
(45) Date of Patent: Nov. 15, 2016

(54) NEAR JUNCTION COOLING FOR GAN DEVICES

(71) Applicants: Miroslav Micovic, Thousand Oaks, CA (US); Alexandros D. Margomenos, Pasadena, CA (US); Keisuke Shinohara, Thousand Oaks, CA (US); Andrea Corrion, Oak Park, CA (US)

(72) Inventors: Miroslav Micovic, Thousand Oaks, CA (US); Alexandros D. Margomenos, Pasadena, CA (US); Keisuke Shinohara, Thousand Oaks, CA (US); Andrea Corrion, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/495,755

(22) Filed: Sep. 24, 2014

Related U.S. Application Data

(62) Division of application No. 13/452,430, filed on Apr. 20, 2012, now abandoned.

(51) Int. Cl.
| | | |
|---|---|---|
| *H01L 23/373* | (2006.01) | |
| *H01L 23/34* | (2006.01) | |
| *H01L 21/306* | (2006.01) | |
| *H01L 23/00* | (2006.01) | |
| *H01L 29/80* | (2006.01) | |

(52) U.S. Cl.
CPC ......... *H01L 23/34* (2013.01); *H01L 21/30617* (2013.01); *H01L 21/30625* (2013.01); *H01L 24/27* (2013.01); *H01L 2924/01006* (2013.01)

(58) Field of Classification Search
CPC ....... H01L 21/04; H01L 21/20; H01L 21/30; H01L 21/31; H01L 21/338; H01L 21/302; H01L 21/461; H01L 31/0328; H01L 31/072; H01L 31/109; H01L 23/48; H01L 29/737; H01L 29/778; H01L 29/78; H01L 29/80; H01L 29/04; H01L 29/161; H01L 27/01
USPC .................. 438/79, 180–183, 167, 172, 194, 438/618–642; 257/714, 722, 717, 718, 720, 257/774, 77, 194, E21.403, E21.407, 257/E29.246
See application file for complete search history.

(56) References Cited

U.S. PATENT DOCUMENTS

| | | | | |
|---|---|---|---|---|
| 5,173,761 | A * | 12/1992 | Dreifus et al. .................. | 257/22 |
| 5,300,188 | A * | 4/1994 | Tessmer .................. | B24B 37/04 |
| | | | | 216/52 |
| 6,265,322 | B1 * | 7/2001 | Anselm et al. ............... | 438/745 |
| 6,989,592 | B2 | 1/2006 | Chang et al. ................. | 257/707 |
| 7,303,947 | B1 * | 12/2007 | Bronecke et al. ........... | 438/167 |
| 7,492,041 | B2 | 2/2009 | Ravi et al. .................... | 257/706 |
| 7,538,423 | B2 | 5/2009 | Ono et al. ..................... | 257/706 |
| 7,579,626 | B2 | 8/2009 | Saxler ............................. | 257/77 |

(Continued)

OTHER PUBLICATIONS

K-C Chen et al., "Thermal Management and Novel Package Design of High Power Light Emitting Diodes", National Cheng Kung University, Taiwan, Electronic Components and Technology Conference, 2008.

(Continued)

*Primary Examiner* — Julia Slutsker
*Assistant Examiner* — Natalia Gondarenko
(74) *Attorney, Agent, or Firm* — Ladas & Parry

(57) ABSTRACT

Apparatus and methods are provided for heat removal and spreading from a field effect transistor (FET) including a substrate, a first source, a first gate, and a drain on the substrate, and a poly-diamond dielectric thermally coupled to the first gate wherein the poly-diamond dielectric facilitates heat removal from a top of the FET.

13 Claims, 5 Drawing Sheets

(56) References Cited

U.S. PATENT DOCUMENTS

| | | |
|---|---|---|
| 7,749,863 B1 | 7/2010 | Micovic ................. 438/459 |
| 7,777,315 B2 | 8/2010 | Noquil ................... 257/678 |
| 2002/0079508 A1* | 6/2002 | Yoshida ................. 257/192 |
| 2006/0027635 A1 | 2/2006 | Schaenzer et al. ...... 228/246 |
| 2006/0091509 A1 | 5/2006 | Zhao ..................... 257/678 |
| 2006/0292747 A1 | 12/2006 | Loh ...................... 438/116 |
| 2007/0054467 A1* | 3/2007 | Currie et al. ........... 438/458 |
| 2007/0075420 A1 | 4/2007 | Hu et al. ................ 257/720 |
| 2007/0247851 A1 | 10/2007 | Villard .................. 362/294 |
| 2008/0099770 A1 | 5/2008 | Mendendorp et al. ..... 257/79 |
| 2008/0122090 A1* | 5/2008 | Hsu et al. .............. 257/746 |
| 2008/0128897 A1 | 6/2008 | Chao .................... 257/713 |
| 2008/0298021 A1 | 12/2008 | Ali et al. ............... 361/705 |
| 2009/0078966 A1* | 3/2009 | Asai et al. ............. 257/194 |
| 2009/0090984 A1* | 4/2009 | Khan et al. ............ 257/409 |
| 2009/0108437 A1 | 4/2009 | Raymond ............... 257/713 |
| 2009/0134421 A1 | 5/2009 | Negley .................. 257/98 |
| 2009/0146186 A1* | 6/2009 | Kub et al. .............. 257/194 |
| 2009/0294941 A1 | 12/2009 | Oh et al. ............... 257/686 |
| 2009/0320990 A1* | 12/2009 | Cohen ............. G01R 1/06716 156/150 |
| 2011/0073912 A1* | 3/2011 | Marui et al. ........... 257/194 |
| 2012/0168206 A1* | 7/2012 | Sekine et al. .......... 174/252 |

OTHER PUBLICATIONS

R. Fowler et al., "Next-Generation Microchannel Coolers", Northrop Grumman, Proceedings of SPIE 2008.

From U.S. Appl. No. 13/452,430, Application and Office Actions, including but not limited to the Office Actions mailed May 2, 2012, Aug. 9, 2013, Sep. 17, 2013, Feb. 3, 2014, May 7, 2014 and Jul. 29, 2014.

* cited by examiner

NEAR JUNCTION COOLING FOR GAN DEVICES

CROSS REFERENCE TO RELATED APPLICATIONS

This application is a divisional application of U.S. patent application Ser. No. 13/452,430, filed on Apr. 20, 2012, which is incorporated herein by reference as though set forth in full.

TECHNICAL FIELD

This disclosure relates to the thermal interfaces for an integrated circuit and in particular thermal interfaces for GaN devices.

BACKGROUND

Heat is becoming a critical bottleneck to the performance and reliability of proposed microelectronic systems. Thermal issues are extremely important to the successful implementation of most modern electronics, especially as we shift to high power density GaN and SiC devices. In most state of the art thermal management approaches for high power density power amplifiers (PA), heat removal from the chip and heat spreading away from the junction is effectively being accomplished from one side of the chip only. Current approaches also rely on thermal interface materials (TIM) (thermal greases, eutectic solders), and heat spreaders for power amplifier attachment to the heat sink resulting in large number of thermal interfaces, potential for thermal voids between the PA and the heat sink and increased assembly costs.

The prior art approaches for cooling GaN devices are summarized in Table 1 below.

TABLE 1

| Prior Art |
| --- |
| Single side (backside) heat spreading and cooling |
| GaN device junctions (field plate or T-gate) are encapsulated in low thermal conductivity materials (air, silicon nitride, etc) |
| GaN PA mounted on heat spreader and heat sink using eutectic solders or similar thermal interface materials which increase the system thermal resistance. Potential of voids in interface layers increase risk of hot-spot formation. |
| Surface enhancement structures (micro-channels, fins etc) machined on heat sink |

Removing heat is critical for the performance and reliability of microelectronic circuits and systems. The situation worsens as the sizes of the microelectronic systems reduce and their power consumption increases due to added functionality. Novel wide-bandgap GaN and SiC devices operate at much higher power densities compared to Si and GaAs devices and also generate more heat. In addition to that the trend for dimensional scaling and 3D integration (size and weight reduction) creates a very challenging environment for all microelectronic systems.

Advances in silicon micromachining, micro-molding, material science (compound heat sinks with matched CTE, thermoplastic TIM etc) and material growth (CVD grown carbon nano-tubes and thin film diamond) over the last decade have significantly increased the efficiency and heat extraction ability of micro-cooling systems. However, none of these technologies are adequate for wide band gap semiconductors (GaN and SiC) which are generating heat fluxes in excess of 1 kW/cm$^2$ and none simultaneously addresses packaging, interconnection and cooling. In addition the prior art does not address a fabrication process that allows the co-fabrication of a diamond heat sink with the device gates so that the diamond heat spreader is in close proximity to the junction, and the ability to offer dual-side cooling without affecting the high frequency operation of the device.

The prior art includes the following.

1. K-C Chen et al, "Thermal Management and Novel Package Design of High Power Light Emitting Diodes", National Cheng Kung University, Taiwan, Electronic Components and Technology Conference, 2008 describes a method for cooling high power light emitting diodes (LED) by doing electroless plating of Cu on the backside of the diode, which reduces junction temperature by up to 40° C. and thermal resistance by as much as 40%. However this does not address front-side cooling, near junction cooling and high frequency operation.

2. US Patent Application: US 2008/0298021 by A. A. Ali et al. discloses the use of CVD deposited thin film diamond for a heat spreader. The chip is mounted on thin film diamond using a TIM material (solder, thermal grease, phase change epoxy, or thin film metal: Ti/Pt/Au layer). The heat spreader is a thin film diamond, a diamond/copper hybrid, a diamond/aluminum hybrid, an aluminum or copper film. Also shown are different embodiments of their structure where heat pipes are embedded in the heat sink for an increased heat transfer coefficient. However, these approaches are not sufficient to cool 1 kW/cm$^2$.

3. R. Feeler et al, "Next-Generation Microchannel Coolers", Northrop Grumman, Proceedings of SPIE 2008, describes a micro-channel cooler for LED arrays using Low Temperature Co-Fired Ceramic (LTCC) material. They describe a heat sink made out of AlN, BeO or CVD diamond under the LED chip, which is connected the LTCC micro-channel. The CTE of LTCC is close to GaAs and InP so hard solder (AuSn) is used to mount the LED on the cooler. The LTTC addresses one major failure mechanism of copper micro-channels, which is their erosion when they are exposed to high water speeds. However, this approach has some disadvantages. First the distance between the backside of the chip and the cooling water is over 300 microns. It is critical to minimize this distance. In addition to that LTCC has low thermal conductivity (3.5 W/mK) compared to AlN (150 W/mK) and copper (400 W/mK). Thus, an additional thin film diamond or AlN heat sink is necessary under the LED chip.

4. US Patent Application US 2009/0294941A1 by J. Oh et al. describes a package-on-package system that includes mounting the chip on a base substrate, positioning an interposer over the chip and forming a heat spreader around the chip and the interposer. This approach focuses on multi-stacked chips and extracting heat from inside the stack by inserting the heat spreader between the packages as well as at the top of the module. The heat spreader surrounds the entire chip. However this approach has disadvantages. First it does not offer direct connection to the bottom of the chip, which is the primary area of heat dissipation coming from the active device junction. In contrast, heat is removed from the edges of the chip where solder is used to connect the heat sink to the chip, which is a very inefficient way to remove heat and definitely inadequate to handle wide band-gap components. Furthermore, the fact that the heat sink surrounds each chip makes integration of multiple chips difficult since significant component area around each chip is lost. Interconnection between different chips is impossible unless they are combined in a single heat sink and redesign of the heat sink will be necessary every time different chips are cooled.

5. US Patent Application US 2006/0027635 A1 by M. J. Schaenzer et al. describes a mounting method where the base of the heat sink is selectively plated with solder and connected to a heat spreader plated with Au. The heat sink is connected to the top of the chip. This approach is close to conventional cooling methods. The disadvantages of this is that it requires a high thermal resistance TIM material (solder) to transfer heat from the chip to the heat sink, it can be used for a single chip only and is not applicable to 3D multi-layer systems or multiple chips integrated in a single system, and it offers no solution for interconnecting multiple chips especially for high frequency applications.

6. More traditional cooling approaches that rely on mounting chips on various heat sinks are disclosed in the following: US 2009/0134421 A1 by G. H. Negley, US 2008/0099770 A1 by N. W. Mendendorp, US 2007/0247851 A1 by R. G. Villard, US 2006/0292747 A1 by B. P. Loh, and U.S. Pat. No. 7,579,626 B2 by A. W. Saxler.

7. US Patent Application US 2009/0108437 A1 by B. D. Raymond discloses a method of creating a heat sink by backside metallization of a wafer. This metallization is realized with composite electroplating of various metallic compounds with variable CTE. Some examples are Cu-Diamond, Cr-Diamond, or metallic compounds with Be, BeO and carbon nano-tubes. After the wafer is backside metalized, the individual chips are diced. This disclosure does not address front-side cooling and it blindly metalizes the entire wafer.

8. US Patent Application US 2006/0091509 A1 by S. Z. Zhao et al. disclosures a traditional cooling approach focusing on flip-chip interconnected packages including the formation of a cavity on the heat sink which allows for easier integration of the chip. The disadvantages of this approach are that it requires special machining of the heat sink and it still needs TIM materials for connecting the chip to the heat sink.

9. US 2008/0128897 A1 by T. W. Chao, describes a more conventional approach focusing on flip-chip mounted chips, which has disadvantages similar to Zhao above. US 2007/0075420 A1 by D. Lu et al, is similar to Raymond above, the main difference being that the devices are flip-chip mounted active face down to a board and then metalized from the back. Again metallic compounds are proposed for better CTE matching. However this does not offer the advantage of processing known-good-die because it requires flip-chip bonding on a board. This is a reliability concern since the solder bumps and the under-fill material used have higher thermal resistance. U.S. Pat. No. 7,492,041 B2, by K. Ravi et al. describes the combination of a Si wafer with a diamond wafer to form a heat sink on the backside of a silicon wafer. It does not address near junction heat removal and front-side cooling of devices.

10. U.S. Pat. No. 7,777,315 by J. Noqil describes a dual side cooling integrated power device module and methods of manufacture. However, the parts are integrated together using a molding material which is some form of resin, which is a low thermal conductivity material.

11. U.S. Pat. No. 6,989,592 by Chang et al., describes a dual side cooling approach using epoxy on the front side of the chip to transition heat from the front-side to a heat exchanger. This approach cannot be extended to high frequency power devices due to the epoxy that has to surround the interconnects and also is limited with respect to its heat flux removal rate by the thermal conductivity of the epoxy which is not high.

12. U.S. Pat. No. 7,538,423 by T. Ono et al., describes a way to fabricate a heat sink using insulating diamond at the backside of a wafer, which does not address the near junction of the device. Nor can it be used on the front-side of the device where the junction is exposed.

13. U.S. Pat. No. 7,749,863 by M. Micovic, describes a method for fabricating a thermal management substrate on a SOI silicon wafer. However, Micovic does not address two issue 1) the ability to make diamond heat spreaders on the front-side in close proximity to the junction and 2) the ability to remove heat from the front-side with the addition of front-side heat sinks.

What is needed is a better cooling approach for GaN devices. In particular what is needed are cooling approaches that allow the integration of high efficiency high performance spreaders on the front-side in close proximity to the junction and that have the ability to remove heat from the front-side with the addition of front-side heat sinks. The embodiments of the present disclosure answer these and other needs.

SUMMARY OF INVENTION

In a first embodiment disclosed herein, a field effect transistor (FET) comprises a GaN, AlGaN or AlN substrate, a first source, a first gate, and a drain on the substrate, and a first poly-diamond dielectric thermally coupled to the first gate, wherein the first poly-diamond dielectric facilitates heat removal from a top of the FET.

In another embodiment disclosed herein, a method of providing heat spreading from a field effect transistor (FET) comprises forming a first source, a first gate, and a drain on a GaN, AlGaN or AlN substrate, forming a first poly-diamond dielectric thermally coupled to the first gate, forming a coating on the first source, the first gate, the drain, and the first poly-diamond dielectric, forming a metal bridge over the coating, forming a thermal via thermally coupled to the metal bridge; and forming a heat sink coupled to the thermal via.

In yet another embodiment disclosed herein, a method of providing heat spreading from a field effect transistor (FET) comprises depositing a $SiO_2$ mask on a substrate to define source and drain areas, forming n+ GaN ohmic regrowth by molecular beam epitaxy (MBE) in the source and drain areas, forming poly GaN on the $SiO_2$ mask, removing the poly GaN and the $SiO_2$ mask, depositing a SiN layer for passivation of a remaining surface, defining sacrificial source, drain, and gate contacts using thick sacrificial material, depositing poly-diamond dielectric at a high temperature by hot-wire chemical vapor deposition (CVD), planarizing the poly-diamond dielectric and the sacrificial material using chemical mechanical polishing (CMP), forming large cross section gates by repeating the steps of: defining sacrificial source, drain, and gate contacts using thick sacrificial material, depositing poly-diamond dielectric at a high temperature by hot-wire chemical vapor deposition (CVD), and planarizing the poly-diamond dielectric and the sacrificial material using chemical mechanical polishing (CMP), selectively removing the sacrificial material by wet etching, selectively removing the SiN by inductively coupled plasma reactive ion etching (ICP-RIE), metalizing source and drain ohmic contacts and gate Schottky contacts by plasma-atomic layer deposition (ALD) and electro-plating, depositing a first benzocyclobutene (BCB) coating, patterning the first BCB coating, forming a thick plated metal bridge of Cu, Ag, or Au over the patterned first BCB coating, depositing a second BCB coating, patterning the second BCB coating, plating a thermal via to the metal bridge, and forming a heat sink on the thermal via.

These and other features and advantages will become further apparent from the detailed description and accompanying figures that follow. In the figures and description, numerals indicate the various features, like numerals referring to like features throughout both the drawings and the description.

DETAILED DESCRIPTION

Figure 1:
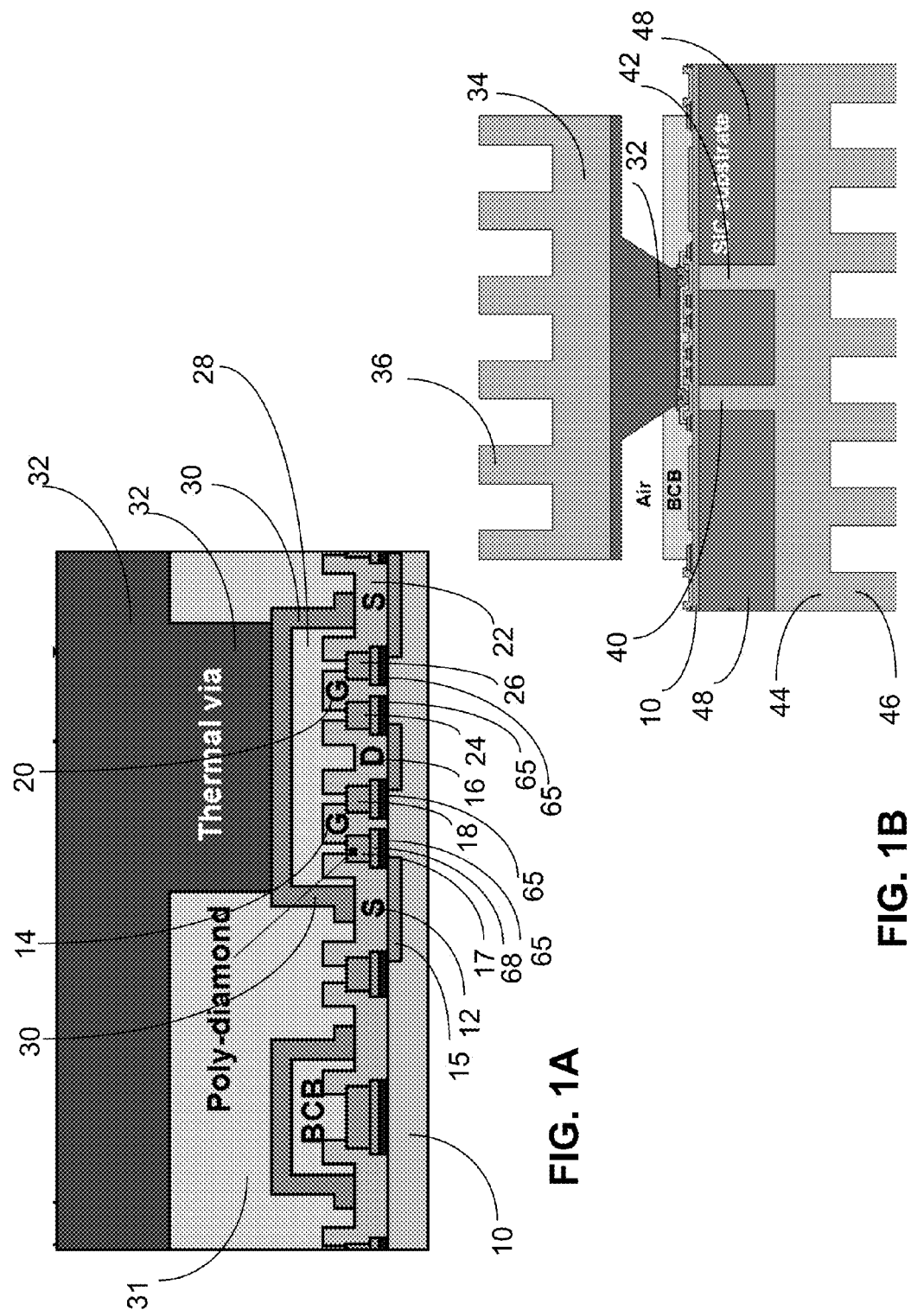
FIGS. 1A and 1B show near junction cooling for a device in accordance with the present disclosure.

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure minimizes the number of thermal interfaces between the heat source (transistor junction) and heat sink, eliminates the need for thermal interface materials, eliminates potential for thermal voids, it is compatible with existing GaN device and MMIC fabrication processes and can be extended to three dimensional multichip integration with built in thermal management. Key features of the present disclosure include: heat removal from both sides of the chip, high thermal conductivity poly-diamond heat spreader in close thermal contact with transistor gate to enhance heat spreading from transistor junction on the front side of the chip, a gate fabrication process compatible poly-diamond deposition at 800° C., electroformed Cu or Ag top heat-sinks with integrated micro-channels for forced cooling in direct thermal contact with the active transistor area for front-side heat removal, and an electroformed copper (Cu) or silver (Ag) bottom heat-sink with integrated micro-channels for forced cooling in direct thermal contact with a high conductivity SiC substrate and metal filled through substrate vias for backside heat removal.

These approaches have the potential to enable gallium nitride (GaN) power amplifiers (PA) to operate with at least a factor of three higher power handling than is currently feasible using conventional thermal management technology. The approach enables the integration of high thermal conductivity (>200 W/m-C) polycrystalline diamond heat spreaders into a high performance RF GaN device technology, dramatically improving heat transfer. Integration of poly-diamond has been a highly challenging problem to date due to the high process temperatures (>800° C.) required for high quality diamond deposition and the need to limit exposure of completed transistor gates to high process temperatures. According to the present disclosure, a high quality poly-diamond deposition may be integrated with high performance GaN transistor technology, enabling very high power density. Further, by combining the heat spreading capability of the near-junction deposited diamond with electroformed front and backside heat-spreaders according to the present disclosure a greater than three times improvement in power density may be achieved over the prior art.

According to the present disclosure the number of thermal interfaces between the junction and the heat sink are minimized by eliminating the need for thermal interface materials, reducing the potential for thermal voids, and mitigating the risk of critical heat flux condition in close proximity to the active device.

Gallium nitride's intrinsic material properties and higher thermal conductivity SiC substrate enable amplifiers that have significantly higher output power and 10× higher power density compared to competing technologies (GaAs, InP). Radio frequency (RF) output power levels in excess of 30 W/mm have been reported in continuous wave (CW) mode at 8 GHz for discrete field plate gate GaN devices with gate widths of 246 µm. For a typical X-band MMIC unit cell device with gate periphery of between 1-1.5 mm the CW-mode output power density drops to 5-6 W/mm, due to strong device heating. This further drops to 2-3 W/mm for power monolithic microwave integrated circuits (MMICs) that combine multiple unit cells (>3 mm gate periphery). Prior art GaN power MMICs have to be operated in a low duty cycle (less than 10%) pulsed mode to prevent MMICs from overheating (Tj>200° C.) and to maintain power density of more than 3 W/mm.

Power modules used in electronic warfare (EW), communication and radar systems, such as GaN power amplifiers (PAs), result in a fairly large size, weight and power consumption (SWaP). In the prior art the PA performance is restricted to power densities close to 2 W/mm (CW) thus, for example, to achieve 20 W of output power it is necessary to combine twelve 2 mm devices. According to the present disclosure, higher power densities can be obtained, thus the number of devices and SWaP can be reduced. Higher power density is desirable because with a higher power density PA, few devices are needed which reduces the power loss in a power combiner.

FIGS. 1A and 1B show near junction cooling for a device in accordance with the present disclosure. Near junction thermal transport is based on the addition of a high thermal conductivity poly-diamond dielectric on the front-side of the transistors. Both sides of the transistors are connected to metal heat sinks through thermal vias.

As shown in FIG. 1A, an integrated circuit which includes a field effect transistor (FET) has a source 12, a gate 14, and a drain 16 on a substrate 10, which may be GaN, AlGaN or AlN. The FET may have a double field-plate gate structure with gates 14 and 20, as shown in FIG. 1A, for optimum power performance. FIG. 1A shows gate 20 and a source 22 on the substrate 10. Below the sources 12 and 22 and below drain 16 are areas of n+ GaN ohmic regrowth 15, for low contact resistance of <0.2 Ω·mm and high thermal stability.

Heat spreading from the top of the FET on the integrated circuit is provided by poly-diamond dielectric 17 and 18 in contact with gate 14 and poly-diamond dielectric 24 and 26 in contact with gate 20, and by heat sink 34, shown in FIG. 1B, and thermal via 32 plated onto metal bridge 30, as shown in FIG. 1A.

Poly-diamond dielectric 17 and 18 are in contact with gate 14 and between the source 12 and the gate 14 and between the gate 14 and the drain 16, respectively. Poly-diamond dielectric 24 and 26 are in contact with gate 20 and between the drain 16 and the gate 20 and between the gate 20 and the source 22, respectively. A passivation layer 65, which may be SiN, is between the poly-diamond dielectric 17, 18, 24 and 24 and the substrate 10.

A benzocyclobutene (BCB) coating 28 is over the poly-diamond dielectric 17, 18, 24 and 26, the gates 14 and 20, the drain 16, and a portion of the sources 12 and 22. A metal bridge 30, which may be a thick plated metal (Cu, Ag, or Au) is formed over the BCB coating 28 and connected to the sources 12 and 22. A thermal via 32 and heat sink 34 are plated onto the metal bridge 30. The heat sink 34 may be Cu or Ag and have double side microchannels 36 or micro-fins 36 for forced liquid cooling.

In some areas of the integrated circuit where thermal considerations are less, a benzocyclobutene (BCB) coating 31 may be between the integrated circuit and the thermal via 32, as shown in FIG. 1A.

As shown in FIG. 1B, heat spreading from the bottom of the integrated circuit is provided by a SiC substrate 48 coupled to the GaN substrate 10, by metal filled through substrate vias 40 and 42, and by heat sink 44. The heat sink 44 may be Cu or Ag and have double side microchannels 46 or micro-fins 46 for forced liquid cooling.

Figure 2:
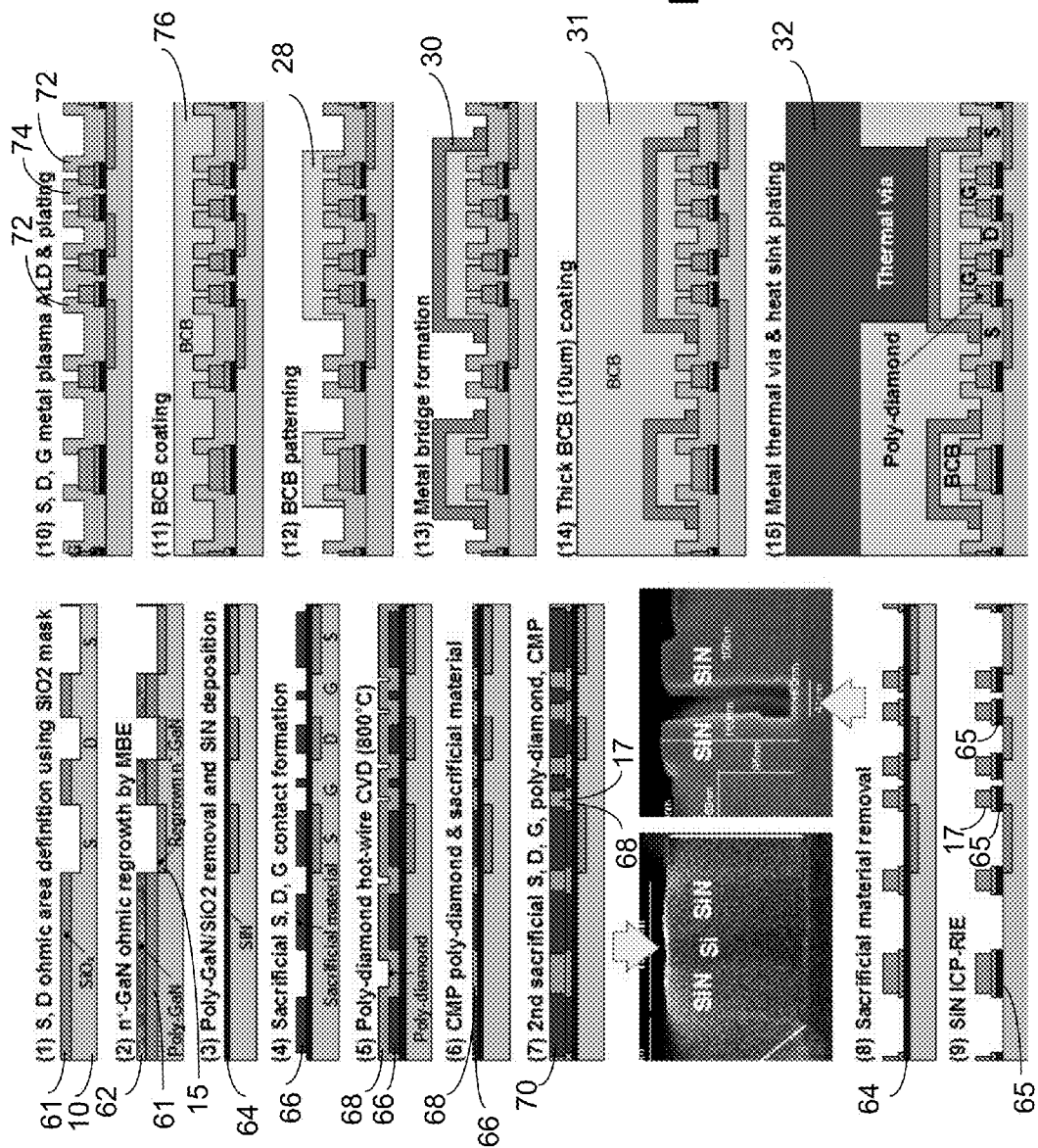
FIG. 2 shows a process diagram to form near junction cooling for a device in accordance with the present disclosure.

FIG. 2 shows a process diagram to form near junction cooling for a device in accordance with the present disclosure. In step (1) a $SiO_2$ mask 61 is deposited on the substrate 10 to define source and drain areas. In step (2) n+ GaN ohmic regrowth 15 is performed by molecular beam epitaxy (MBE) in the source and drain areas, and poly GaN 62 is formed on the $SiO_2$ mask 61. The regrown n+-GaN ohmic contacts 15 have been shown to exhibit an extremely low contact resistance of <0.2 Ω·mm and high thermal stability. Regrown ohmics help because they reduce ohmic contact resistance and due to the fact that they are deposited at high temperature, ohmic contacts are more thermally stable than conventional alloyed metal contacts.

Then in step (3) the poly GaN 62 and the $SiO_2$ mask 61 are removed and the surface is passivated with a 500 Å SiN layer 64. Then in step (4) sacrificial source, drain, and gate contacts are defined using 2000 Å-thick sacrificial material 66. Then in step (5) poly-diamond dielectric 68 is deposited at a high temperature (800° C.) by hot-wire chemical vapor deposition (CVD). Next in step (6) the poly-diamond dielectric 68 and the sacrificial material 66 are planarized using chemical mechanical polishing (CMP). As shown in FIG. 2 step (6) both the poly-diamond dielectric 68 and the sacrificial material 66 are planarized, and both the poly-diamond dielectric 68 and the sacrificial material 66 are substantially reduced in thickness during planarization from their respective thickness in step (5). Then in step (7), steps (4) to (6) are repeated to form gates with a large cross-section by using a thicker (1 μm) sacrificial material 70. Next in step (8), the sacrificial material 70 is selectively removed by wet etching. SEM images are shown in FIG. 2 illustrating the result at steps (7) and (8).

In step (9) the SiN 64 is selectively removed by inductively coupled plasma reactive ion etching (ICP-RIE), so that SiN 65 is left between the poly-diamond dielectric and the substrate 10. Next in step (10) source and drain ohmic contacts 72 and gate Schottky contacts 74 are metalized by plasma-atomic layer deposition (ALD) and electro-plating. Then in step (11) a benzocyclobutene (BCB) coating 76 is deposited. Next in step (12) the BCB coating is patterned to form patterned BCB coating 28. Then in step (13) a thick plated metal (Cu, Ag, or Au) bridge 30 is formed over the patterned BCB coating 28. The metal bridge may be connected to the source contacts 12 and 22. The metal bridge 30 electrically connects the source contacts 12 and 22. The thermal via 32 contacts the bridge 30 and is as close as possible to the heat generating part of the device, the gate, without compromising the MMIC performance. The bridge 30 plated metal may be several microns thick and may be in the range of 2 to 3 microns.

Next in step (14) a BCB coating 31, which may be 10 μm thick, is deposited. Then in step (15), the BCB coating 31 is patterned to expose the metal bridge 30 and a thermal via 32 and heat sink 34 are plated onto the metal bridge 30.

The combination of ohmic regrowth, and sacrificial/CMP process result in an inherently robust MMIC manufacturing process. Regrown ohmic contacts provide improved thermal stability and reduced contact resistance relative to conventional alloyed metal contacts, while the sacrificial/CMP fabrication process described above minimizes high-power plasma etching steps to reduce the potential for epitaxial material damage.

Figure 3:
FIG. 3 shows a SEM image of a 2.5 µm poly-diamond film deposited on a patterned wafer in accordance with the present disclosure.

FIG. 3 shows the excellent step coverage that may be achieved with 2.5 μm thick poly-diamond deposited on a 170 nm high feature.

Figure 4:
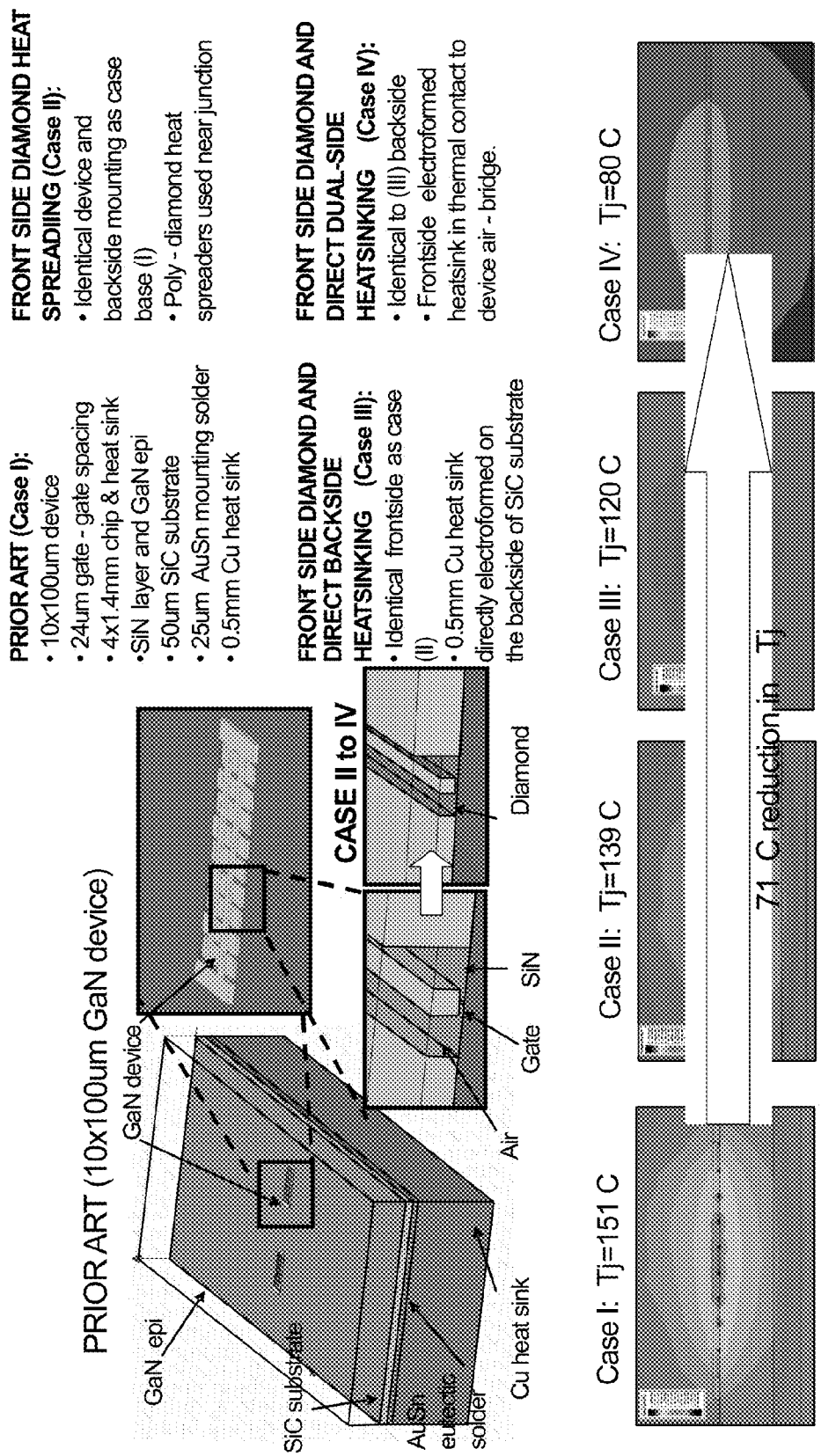
FIG. 4 shows the results of a thermal simulation comparing the prior art to cooling in accordance with the present disclosure.

FIG. 4 summarizes the results of a thermal simulation using Ansoft ePhysics comparing the cooling according to the present disclosure to a conventionally mounted device using 2 mil thick eutectic solder on a Cu heat sink. In all cases the same dimensions, design parameters, and constant area for convective heat transfer were used to facilitate comparison. The simulation modeled a variable thermal load (0.5-12 W/mm) on the GaN chip, a natural convection boundary condition from the top MMIC surface to a 35° C. ambient, an adiabatic boundary condition around the structure and varied the heat sink's heat transfer coefficient (baseplate temperature 35° C.). The convective heat transfer coefficients explored ranged from 1000 $W/m^2K$ (forced air cooling) up to 80,000 $W/m^2K$, (advanced two-phase cooling with surface enhancement). The simulation shows a 12° C. reduction in Tj with front-side diamond heat spreading, 31° C. reduction with both front-side diamond and direct back-side cooling, and finally a 71° C. reduction with dual-side cooling and diamond heat spreading according to the present disclosure.

Figures 5A, 5B:
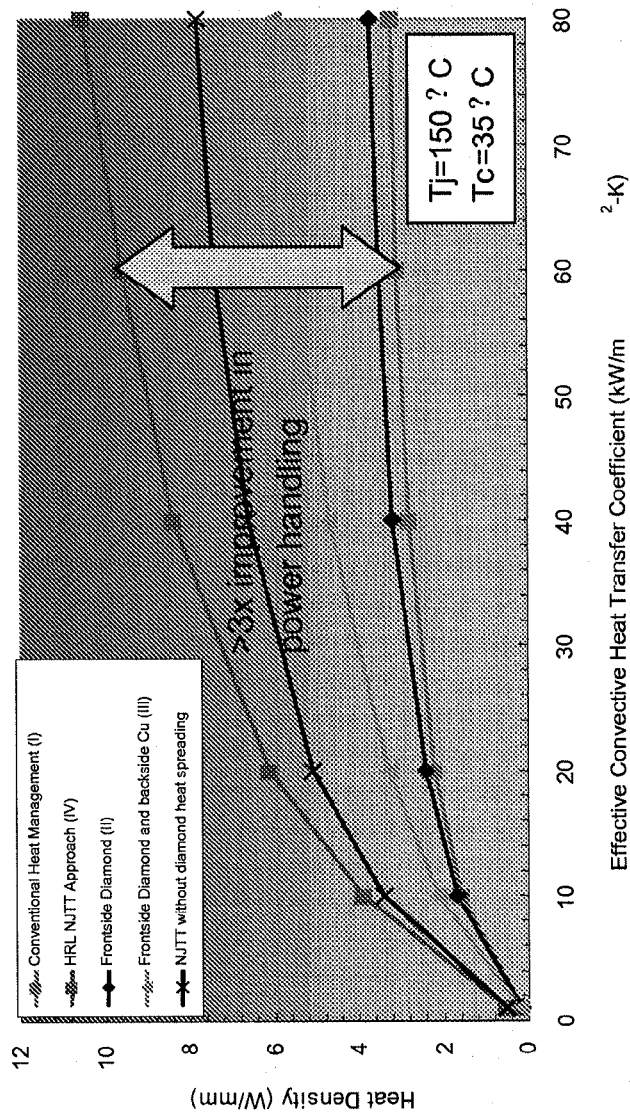
FIGS. 5A and 5B show simulation results of the cooling configurations vs. convective heat transfer coefficient in accordance with the present disclosure.

FIGS. 5A and 5B summarize the results of an analysis and show the power density vs. the convective heat transfer coefficient when Tj is kept at 150° C. The combination of near junction diamond heat spreading and dual side direct heatsinking with minimum number of thermal interface layers can offer 3× improvement in power handling and enable high power GaN devices.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method of providing heat spreading from a field effect transistor (FET) comprising:
    depositing a SiO$_2$ mask on a substrate to define source and drain areas;
    forming n+ GaN ohmic regrowth by molecular beam epitaxy (MBE) in the source and drain areas;
    forming poly GaN on the SiO$_2$ mask;
    removing the poly GaN and the SiO$_2$ mask;
    depositing a SiN layer for passivation of a remaining surface;
    defining sacrificial source, drain, and gate contacts by depositing and patterning a first sacrificial material;
    depositing a first poly-diamond dielectric at a temperature by hot-wire chemical vapor deposition (CVD) on the patterned first sacrificial material having a first sacrificial material thickness;
    planarizing the first poly-diamond dielectric and the patterned first sacrificial material using chemical mechanical polishing (CMP), wherein the planarizing substantially reduces a first poly-diamond dielectric thickness, and wherein the planarizing substantially reduces the first sacrificial material thickness;
    depositing a second sacrificial material and patterning the second sacrificial material to form openings in the second sacrificial material aligned with the planarized first poly-diamond dielectric,
    wherein a width of the patterned second sacrificial material is greater than a width of the patterned first sacrificial material;
    depositing a second poly-diamond dielectric on the planarized first poly-diamond dielectric at a temperature by hot-wire chemical vapor deposition (CVD);
    planarizing the second poly-diamond dielectric and the patterned second sacrificial material using chemical mechanical polishing (CMP) so that the second poly-diamond dielectric remains only in the openings and a thickness of the patterned second sacrificial material is greater than a thickness of the patterned first sacrificial material;
    selectively removing the patterned first sacrificial material and the patterned second sacrificial material by wet etching;
    selectively removing the SiN by inductively coupled plasma reactive ion etching (ICP-RIE);
    metalizing source and drain ohmic contacts and gate Schottky contacts by plasma-atomic layer deposition (ALD) and electro-plating;
    depositing a first benzocyclobutene (BCB) coating;
    patterning the first BCB coating;
    forming a plated metal bridge of Cu, Ag, or Au over the patterned first BCB coating;
    plating a thermal via to the metal bridge; and
    forming a heat sink on the thermal via.

2. The method of claim 1 wherein the SiN layer is approximately 500 Å thick.

3. The method of claim 1 wherein defining sacrificial source, drain, and gate contacts by depositing and patterning the first sacrificial material comprises using 2000 Å thick sacrificial material.

4. The method of claim 1 wherein depositing the first poly-diamond dielectric by hot-wire chemical vapor deposition (CVD) is at a temperature of 800° C.

5. The method of claim 1 wherein depositing a first benzocyclobutene (BCB) coating comprises depositing a 10 µm thick BCB coating.

6. The method of claim 1 further comprising:
    coupling a SiC substrate to the substrate;
    forming a metal via through the SiC substrate thermally coupled to the substrate; and
    coupling a heat sink to the metal via.

7. The method of claim 1 wherein the substrate comprises GaN, AlGaN or AlN.

8. The method of claim 1 further comprising:
    depositing a second BCB coating; and
    patterning the second BCB coating.

9. A method of making heat spreading from a field effect transistor (FET) comprising:
    defining sacrificial source, drain, and gate contacts by depositing and patterning a first sacrificial material on a substrate;
    depositing a first poly-diamond dielectric at a temperature by hot-wire chemical vapor deposition (CVD) on the patterned first sacrificial material having a first sacrificial material thickness;
    planarizing the first poly-diamond dielectric and the patterned first sacrificial material using chemical mechanical polishing (CMP), wherein the planarizing substantially reduces a first poly-diamond dielectric thickness, and wherein the planarizing substantially reduces the first sacrificial material thickness;
    depositing a second sacrificial material and patterning the second sacrificial material to form openings in the second sacrificial material aligned with the planarized first poly-diamond dielectric,
    wherein a width of the patterned second sacrificial material is greater than a width of the patterned first sacrificial material;

depositing a second poly-diamond dielectric on the planarized first poly-diamond dielectric at a temperature by hot-wire chemical vapor deposition (CVD);

planarizing the second poly-diamond dielectric and the patterned second sacrificial material using chemical mechanical polishing (CMP) so that the second poly-diamond dielectric remains only in the openings and a thickness of the patterned second sacrificial material is greater than a thickness of the patterned first sacrificial material; and selectively removing the patterned first sacrificial material and the patterned second sacrificial material by wet etching.

10. The method of claim 9 wherein defining sacrificial source, drain, and gate contacts by depositing and patterning the first sacrificial material comprises using 2000 Å thick sacrificial material.

11. The method of claim 9 wherein:

depositing the first poly-diamond dielectric by hot-wire chemical vapor deposition (CVD) is at a temperature of 800° C.; and depositing the second poly-diamond dielectric by hot-wire chemical vapor deposition (CVD) is at a temperature of 800° C.

12. The method of claim 9 further comprising:

forming a benzocyclobutene (BCB) coating on the second poly-diamond dielectric;

forming a plated metal bridge of Cu, Ag, or Au over the BCB coating; and forming a heat sink on the plated metal bridge.

13. The method of claim 9 further comprising:

coupling a SiC substrate to the substrate;

forming a metal via through the SiC substrate thermally coupled to the substrate; and coupling a heat sink to the metal via.

\* \* \* \* \*